United States Patent [19]

Shiozawa et al.

[11] Patent Number: 5,140,366
[45] Date of Patent: Aug. 18, 1992

[54] EXPOSURE APPARATUS WITH A FUNCTION FOR CONTROLLING ALIGNMENT BY USE OF LATENT IMAGES

[75] Inventors: Takahisa Shiozawa, Yokohama; Tsuneo Kanda, Kawasaki; Akiyoshi Suzuki, Tokyo, all of Japan

[73] Assignee: Canon Kabushiki Kaisha, Tokyo, Japan

[21] Appl. No.: 742,535

[22] Filed: Aug. 8, 1991

Related U.S. Application Data

[63] Continuation of Ser. No. 642,150, Jan. 16, 1991, abandoned, which is a continuation of Ser. No. 547,334, Jul. 5, 1990, abandoned, which is a continuation of Ser. No. 384,069, Jul. 24, 1989, abandoned, which is a continuation of Ser. No. 199,670, May 27, 1988, abandoned.

[30] Foreign Application Priority Data

May 29, 1987 [JP] Japan ................................. 62-131077
Jun. 19, 1987 [JP] Japan ................................. 62-151061

[51] Int. Cl.[5] .................... G03B 27/42; G03B 27/32
[52] U.S. Cl. .................................... 355/53; 355/77
[58] Field of Search ........................... 355/53, 54, 77

[56] References Cited

U.S. PATENT DOCUMENTS

| | | | |
|---|---|---|---|
| 3,796,497 | 3/1974 | Mathisen et al. | 355/53 |
| 4,577,957 | 3/1986 | Phillips | 355/53 |
| 4,620,785 | 11/1986 | Suzuki et al. | 355/53 |
| 4,657,379 | 4/1987 | Suwa | 355/53 |
| 4,659,226 | 4/1987 | Elabo | 355/53 |
| 4,669,867 | 6/1987 | Uda et al. | 355/53 |
| 4,741,622 | 5/1988 | Suwa et al. | 356/401 |
| 4,780,617 | 10/1988 | Umatate et al. | 250/548 |

*Primary Examiner*—Monroe H. Hayes
*Attorney, Agent, or Firm*—Fitzpatrick, Cella, Harper & Scinto

[57] ABSTRACT

Disclosed is an exposure apparatus for printing a pattern of a reticle on different shot areas of the wafer in a step-and-repeat manner. In the disclosed apparatus, an image of an alignment mark of the reticle is printed, by use of a projection lens system, on each of some shot areas of the wafer which are selected as the subject of detection. By this, a latent image of the reticle mark is formed on each of the selected shot areas. The latent image of the reticle mark is detected by a microscope which may be a phase contrast microscope and, from the results of detection concerning all the latent images of the reticle mark, a reference (correction) grid representing the coordinate positions of all the shot areas of the wafer is prepared and stored. In accordance with the stored reference grid, the stepwise movement of the wafer is controlled at the time of the step-and-repeat exposures of the wafer. This assures improved throughput of the apparatus. Further, use of the phase contrast microscope for the detection of the latent image of the reticle mark ensures further improvement in the alignment accuracy.

22 Claims, 10 Drawing Sheets

EXPOSURE APPARATUS WITH A FUNCTION FOR CONTROLLING ALIGNMENT BY USE OF LATENT IMAGES

This application is a continuation of prior application, Ser. No. 07/642,150 filed Jan. 16, 1991, which application is a continuation of prior application, Ser. No. 07/547,334 filed Jul. 5, 1990, which application is a continuation of prior application, Ser. No. 07/384,069 filed Jul. 24, 1989, which application is a continuation of prior application, Ser. No. 07/199,670 filed May 27, 1988, all now abandoned.

FIELD OF THE INVENTION AND RELATED ART

This invention relates to an exposure apparatus suitably usable in the process of manufacture of semiconductor microcircuits, for photolithographically printing an image of an original such as a reticle on a workpiece such as a semiconductor wafer. More particularly, the invention is concerned with an alignment and exposure apparatus having a function for controlling the alignment of a wafer by use of a latent image (photoprint) of an alignment mark which image is formed on the wafer.

Japanese Laid-Open Patent Application, Laid-Open No. Sho61-114529 discloses a step-and-repeat type projection exposure apparatus for photoprinting a circuit pattern of a reticle upon a resist layer on a wafer by use of a projection optical system, wherein, prior to the printing of the circuit pattern, an image of an alignment mark of the reticle is printed on the resist layer of the wafer by use of the projection optical system so as to form a latent image (photoprint) of the alignment mark of the reticle on the wafer. The alignment of the wafer is controlled by use of an alignment mark formed on the wafer and the latent image of the alignment mark of the reticle having been formed on the wafer.

SUMMARY OF THE INVENTION

It is an object of the present invention to provide an improved alignment and exposure apparatus having a function for controlling alignment by use of latent images, by which an improved throughput of the apparatus is ensured.

Briefly, according to one aspect of the present invention, to achieve this object, there is provided an alignment and exposure apparatus wherein a latent image of an alignment mark of a reticle is formed on each of some of different shot areas on a wafer and wherein the thus formed latent images of the alignment mark of the reticle are detected to obtain, by computation, information concerning the alignment of all the shot areas on the wafer. At the time of step-and-repeat exposures of the wafer, the thus obtained information is used to control the alignment of each shot area of the wafer. The number of the shot areas upon which the latent images of the reticle mark are formed may be determined as desired provided that the alignment accuracy is not deteriorated significantly. For example, a number from 6-8 may be selected. On the basis of the results of the detection of the latent images formed on the preselected shot areas, the position of grid points concerning all the shot areas of the wafer, arrayed as a grid, may be determined statistically by computation, so that each shot area of the wafer may be aligned by a so-called global alignment method. Details of the process of such a statistical determination of the grid points are disclosed in a U.S. Patent Application, entitled "an alignment method for use in a step-and-repeat type exposure apparatus", Bunei Hamasaki, et al., filed Mar. 17, 1988 and corresponding to Japanese Patent Application No. Sho62-64331 and assigned to the same assignee of the subject application.

The alignment control of the described manner assures improved throughput of the exposure apparatus without degrading the alignment accuracy, particularly as compared with a method wherein a latent image of a reticle mark is formed on every shot area of the wafer so that each shot area of the wafer is aligned by detecting a corresponding latent image of the reticle mark.

It is another object of the present invention to provide an alignment and exposure apparatus having a function for controlling alignment by use of latent images of an alignment mark of a reticle, by which the alignment accuracy can be improved significantly.

Depending on the process conditions (the amount of exposure, the nature of a resist material used, etc.) at the time of formation of a latent image of a reticle mark on a wafer, the property (transmission factor, refractive index, etc.) of the resist material in the region upon which the latent image is formed shows only a small amount of change, which results in poor contrast of the latent image. When an alignment detecting optical system uses a bright-field microscope, it is not easy to detect the latent image of the reticle mark, such that there is a possibility of failure in the detection of the latent image.

The tendency of poor contrast is particularly notable in a case when a resist material used has a sensitivity to light of a deep-UV region (e.g. having a wavelength of about 248 nm). Further, the tendency is also notable in a case when the optical system for observing the latent image is designed and constructed for use with a visible light. This is because that the change in the physical property resist material resulting from the exposure to a deep-UV light, more particularly, the change in the physical property related to the transmission factor, occurs only with respect to the wavelength in and near the deep UV-region, which is remarkably different from the region of the visible light used for the observation. It has been found that the major portion of the change in the physical property in that case is the change in the refractive index.

Accordingly, in a second aspect of the present invention, to achieve the second object, there is provided an alignment and exposure apparatus wherein an alignment mark of a reticle is printed on a wafer to form a latent image of the reticle mark; wherein the latent image of the reticle mark thus formed is detected to align the wafer and, thereafter, a circuit pattern of the reticle is printed on the wafer; and wherein for the detection of the latent image of the reticle mark, a phase contrast microscope is used.

When an alignment mark of a reticle is printed on a wafer, a latent image of the reticle mark is formed in a resist material on the wafer. Such a latent image is formed as a portion in which chiefly the refractive index of the resist material is changed, which change is the major portion of the change in the physical property caused by the exposure. When an ordinary bright-field detection method or dark-field detection method is used to observe such a latent image, the latent image is not always detected with good contrast for the reason that the amount of change in the physical property is not large or that the change in the physical property is not effectual to the wavelength of light used for the observation. With the present embodiment, however, a phase contrast microscope is used so that the change in the phase of light due to a minute change in the refractive index can be emphasized as a change in intensity, with the result that the latent image can be detected with a good contrast.

Accordingly, with the present invention, the probability and precision of the detection of the latent image can be improved so that high-precision and stable alignment is assured.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
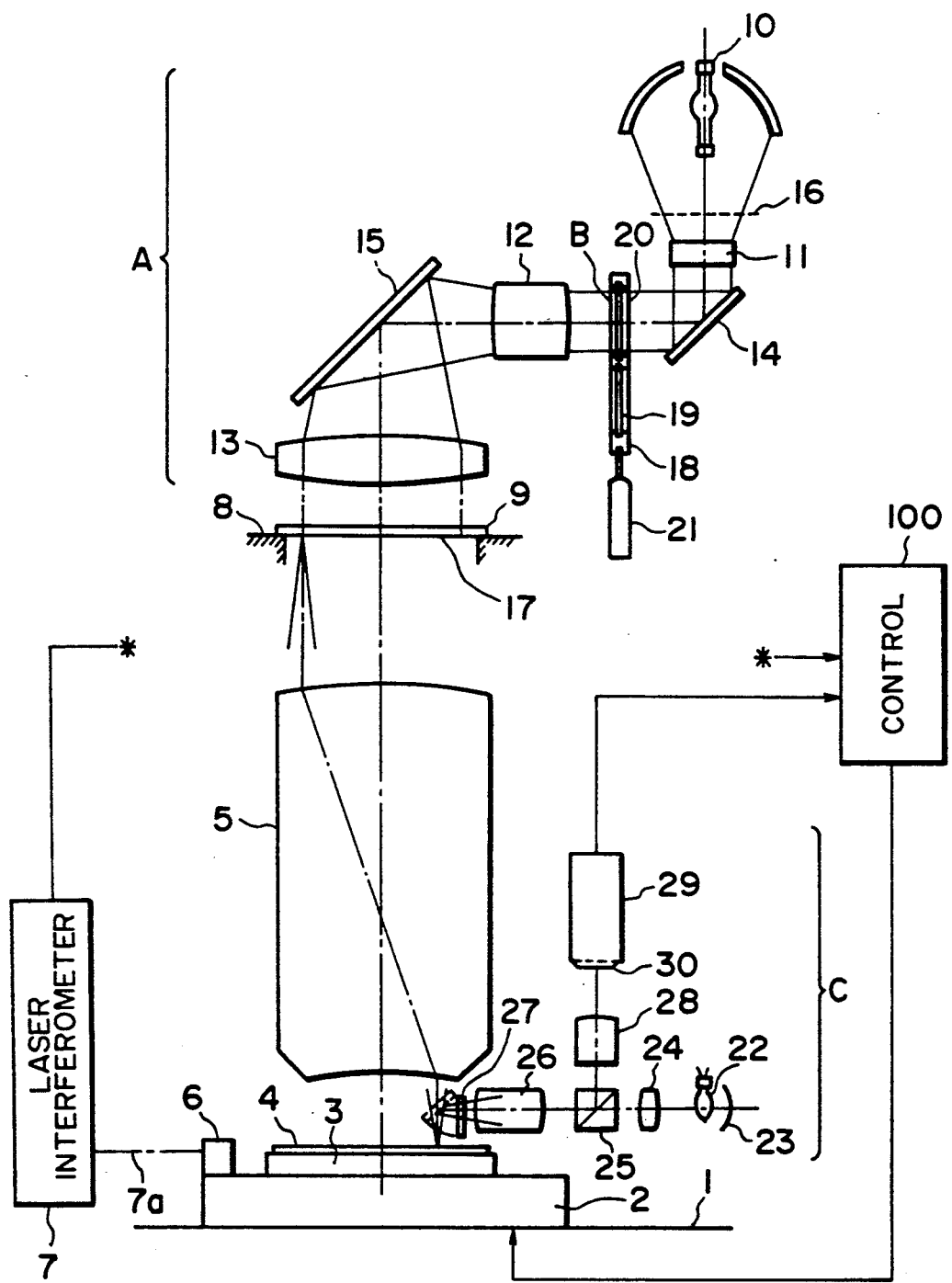
FIG. 1 is a schematic and diagrammatic view of an exposure apparatus according to an embodiment of the present invention.
Figure 2:
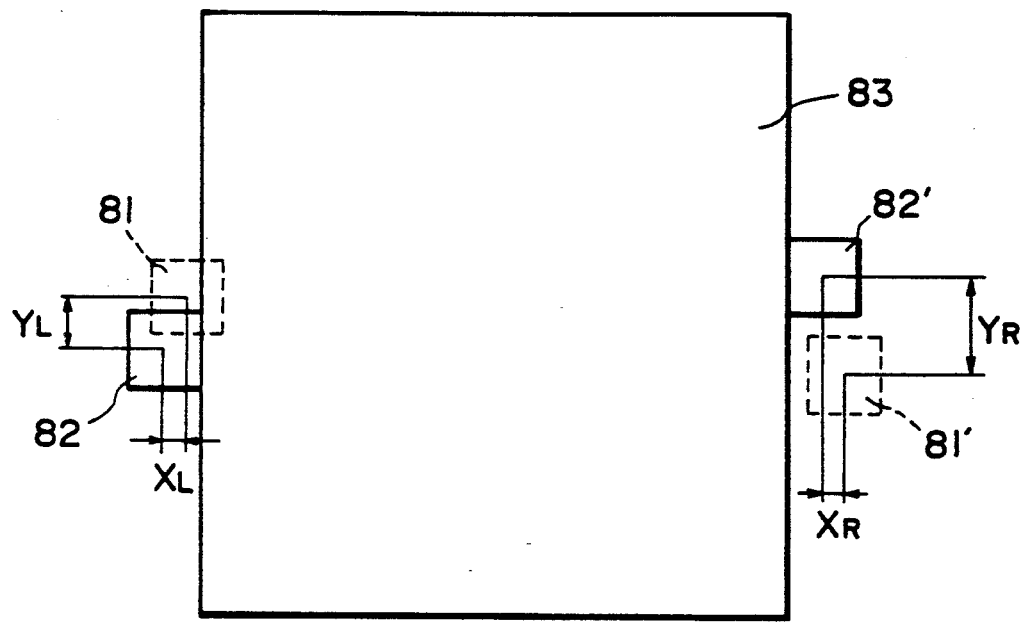
FIG. 2 is a schematic view for explaining the manner of alignment to be made in the FIG. 1 apparatus.

FIG. 1 is a schematic view showing the structure of a step-and-repeat type exposure apparatus according to an embodiment of the present invention. As shown in FIG. 1, the system as a whole of the exposure apparatus is formed and placed on a surface plate 1 whose structure is not shown. More specifically, disposed on the surface plate 1 is a wafer stage 2 which is effective to movably support a wafer holding plate 3 and a wafer 4, held thereby by vacuum attraction, for movement along a plane (X-Y plane) perpendicular to an optical axis of a projection lens system 5 extending in a direction of a Z-axis. The wafer stage 2 has an optical mirror 6 mounted thereto and, by a well-known method by which a light 7a from a laser interferometer 7 is projected upon the mirror 6, the coordinate position of the wafer stage 2 on the X-Y plane can be detected. Also, the wafer stage 2 is controlled by a controller 100 so that it is moved exactly by a designated distance. Disposed above the projection lens system 5 is a reticle 9 which is held by a reticle holding table 8. When the reticle 9 is irradiated with a light supplied from an illumination optical system A disposed above the reticle 9, a pattern formed on the reticle 9 is projected upon and transferred onto one shot area 83 (see FIG. 2) on the surface of the wafer 4, through the projection lens system 5.

The illumination optical system A operates to project a light, emitted from a super-pressure mercury lamp 10, uniformly upon the reticle 9 and includes first to third condenser lenses 11, 12 and 13 and first and second mirrors 14 and 15 for deflecting the light. Shutter 16 is operable to control the exposure.

The second and third condenser lenses 12 and 13 and the second mirror 15 are cooperable to define a plane, at the position denoted by B in FIG. 1, which is optically conjugate with and in an imaging relation with the pattern bearing surface 17 of the reticle 9. At the position B, a suitable masking means is provided so as to allow that only a particular and desired portion of the reticle 9 is illuminated. In the plane denoted at B, a pattern exposing masking member 19 and an alignment mark exposing masking member 20, held by a common frame 18, are provided. These masking members 19 and 20 are alternately inserted into the path of light by the selective actuation of a cylinder 21.

An alignment optical system C is provided so that a portion thereof protrudes into a space between the projection lens system 5 and the wafer 4.

Light from a halogen lamp 22 is concentrated by a collecting mirror 23 and a condensing lens 24 and, after passing through a half prism 25 and an objective lens 26, it is incident upon a movable mirror 27. The movable mirror 27, when it is brought into such a positional relation as inclined by 45 degrees to the optical axis, as shown by broken lines, functions to direct the light having been collected by the objective lens 26 so as to irradiate the wafer surface with the light. The light reflected from the wafer surface goes back by way of the movable mirror 27 and the objective lens 26 to the half prism 25, by which it is deflected upwardly. The deflected light passes through a relay lens 28 and then, is projected upon a surface 30 of an image pickup tube 29 to form thereon an image of the wafer.

Figure 4:
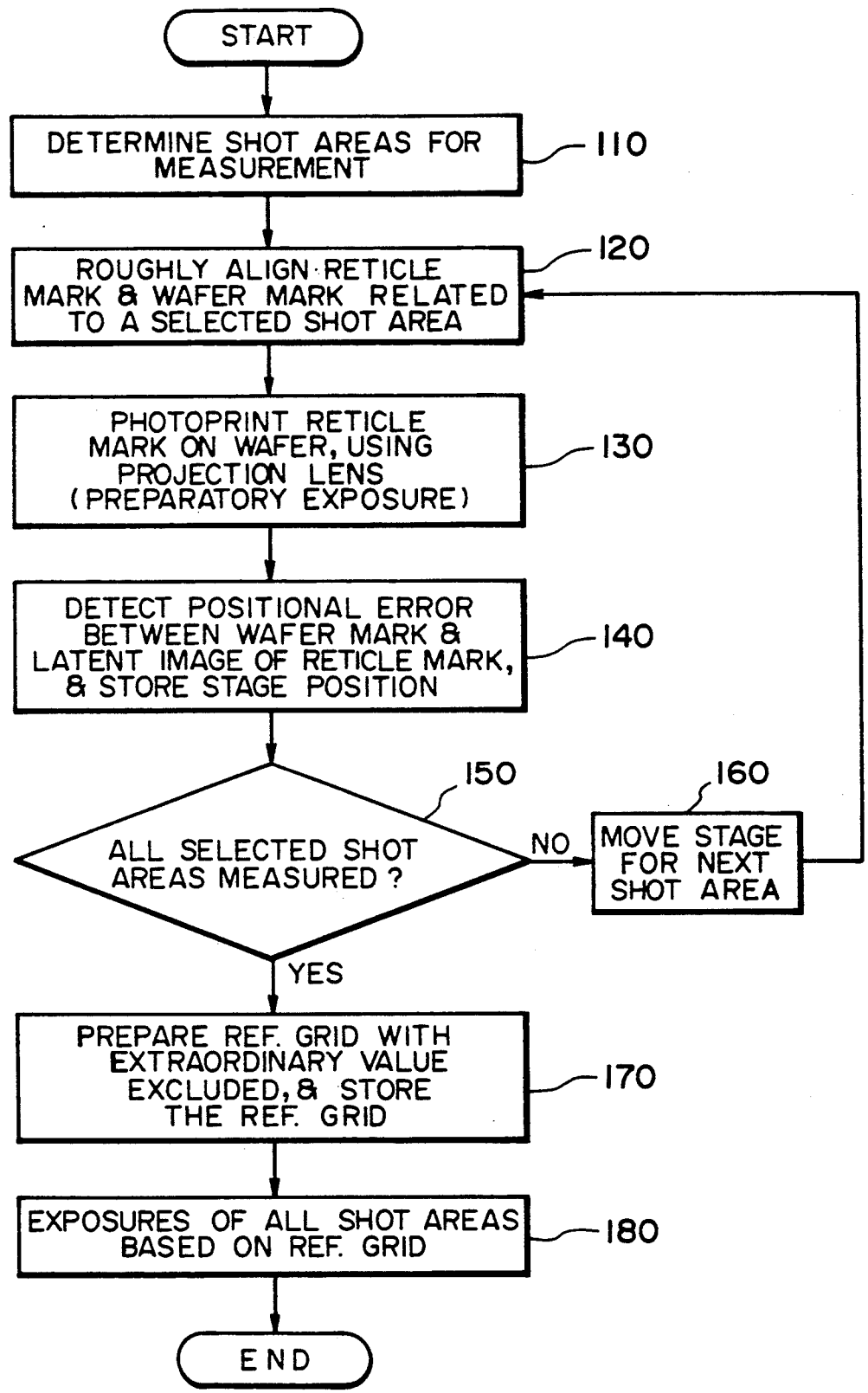
FIG. 4 is a flow chart showing the alignment and exposure operation of the FIG. 1 apparatus.

FIG. 4 is a flow chart showing, as an example, the sequence of an alignment and exposure operation to be made in the FIG. 1 embodiment.

First at Step 110, as the alignment operation starts, the controller 100 operates to determine those of all the shot areas (chips) of the wafer 4 which should be selected as the subject of measurement for obtaining data that allows alignment of the wafer 4. At this time, a larger number of shot areas selected as the subject of measurement assures better alignment accuracy. However, due to the increase in the times of measurement, the throughput becomes lower. Thus, a suitable number of shot areas (for example, 6, 7 or 8) are selected to balance them.

Subsequently, with regard to a first one of the thus selected shot areas, alignment marks 81 and 81' of the reticle 9 (see FIG. 2) and alignment marks 82 and 82' of the wafer 4 are roughly aligned (step 120) by use of a well-known prealignment detecting system, not shown. Then, by actuating the cylinder 21, the masking member 20 is positioned in the path of the light from the illumination optical system and thereafter, only the alignment marks 81 and 81' of the reticle 9 are projected and photoprinted on the wafer 4 by use of the projection lens system 5 with a suitable light quantity. By this, latent images of the alignment marks 81 and 81' of the reticle 9 are printed and formed on the wafer (Step 130). After this, any positional error between each alignment mark 82 (82') of the wafer 4 and a corresponding one of the latent images of the reticle marks is detected by use of the detecting optical system (alignment optical system) C. The thus detected positional errors as well as the position of the stage 2, at that time, in the X-Y plane as outputted from the laser interferometer 7, are stored into a memory (not shown) of the controller 100 (Step 140). Subsequently, discrimination is made at Step 150 as to whether the measurement is completed with regard to all the selected shot areas, determined as the subject of measurement. If not completed, the wafer stage 2 is moved (Step 160) so as to bring the next one of the selected shot areas, selected as the subject of measurement, to the position at which the marks 81 and 81' of the reticle 9 are projected by the projection lens system 5. Then, the operation described with reference to Steps 120–140 is repeated with regard to the next one of the selected shot areas.

In this manner, the measurement operation at Steps 120–140 is repeatedly effected for all the shot areas selected as the subject of measurement. When the result of discrimination at Step 150 shows completion of the positional error measurement, the sequence goes to Step 170. In Step 170, only those of the measured values concerning all the selected shot areas which can be considered as ordinary values are extracted and, by use of the thus extracted measured values, a reference grid which represents the state of array of all the shot areas of the wafer 4 and which corresponds to the positions to be assumed by the wafer stage 2 for exposures of all the shot areas of the wafer, is prepared by calculation by means of the controller 100. The thus prepared reference grid is stored into the memory of the controller 100. At this time, the information obtainable from the alignment mark detecting system C and the laser interferometer 7, provided that one shot area such as at 83 shown in FIG. 2 has alignment marks 82 and 82' and corresponding latent images (photoprints) of the reticle marks 81 and 81' (all of which are formed at opposite sides of the shot area), includes a component concerning four positional errors $\Delta X_R$, $\Delta Y_R$, $\Delta X_L$ and $\Delta Y_L$ and a component concerning the position (x, y) of the wafer stage 2 at that time.

In the present embodiment, the rotational component of each shot area in the X-Y plane, namely a "chip rotation", is a problem to be considered. This can be solved by (1) preparatorily correcting the chip rotation by a known method or (2) by executing a measurement, at the time of the above-described measurement (i.e. the detection of latent images), necessary for correcting the chip rotation and by correcting the chip rotation by use of the obtained results.

In the case (1) described above, the above-described reference grid may be determined by converting the four positional errors into values concerning the center of the shot area, namely by using:

$$\Delta X = (\Delta X_R \Delta X_L)/2$$

$$\Delta Y = (\Delta Y_R \Delta Y_L)/2$$

or, alternatively, by use of the positional errors concerning the marks at one side of the shot area (for example, $\Delta X_R$ and $\Delta Y_R$).

In the case (2) described above, the reference grid may be determined as follows:

First, after completion of the measurement of the positional errors, the rotational component ($\theta$ error) between the reticle 9 and the wafer 4 is corrected. More specifically, from the measured values, the chip rotation ($\Delta \theta$) of each shot area, selected as the subject of measurement, is calculated by means of the controller 100, using an equation $\Delta \theta = (\Delta Y_R - \Delta Y_L)/2$. Any extraordinary value is excluded and, thereafter, a correction angle $\theta$ for the reticle 9 and the wafer 4 is determined statistically. By an amount corresponding to the thus determined angle $\theta$, the wafer stage 2 or the reticle stage 8 is rotated. From the angle $\theta$ of the relative rotation of the wafer stage 2 and the position of each selected shot area of the wafer 4 (selected as the subject of measurement) with respect to the center of rotation, the newly defined coordinate position of each selected shot area is detected by calculation. Thereafter, on the basis of the calculated values and by use of the above-described method, the reference grid is determined and the positions to be assumed by the wafer stage 2 at the time of step-and-repeat exposures of all the shot areas of the wafer 4 are stored. As an alternative, the reference grid may be determined by measuring again, after the correction by the angle $\theta$, any positional errors of the marks by use of the latent images and by using the results of re-measurement essentially in the same manner as of the case (1).

Figure 5:
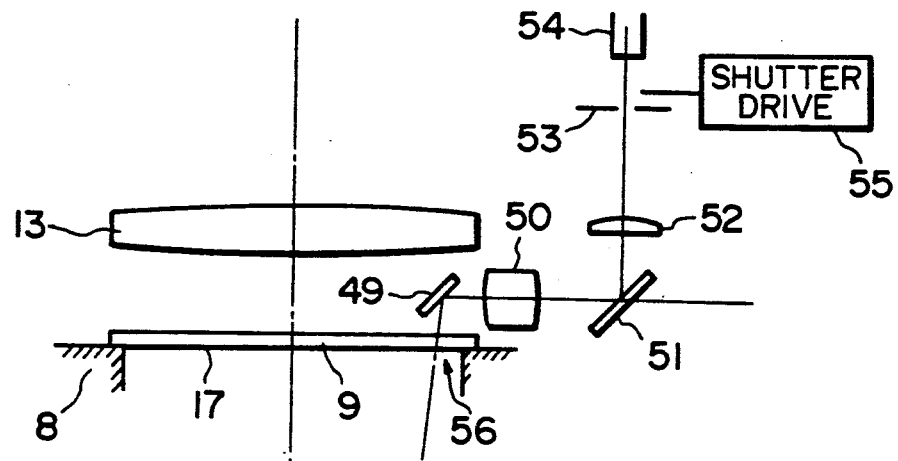
FIG. 5 is a schematic view exemplifying an alignment mark to be used, with the FIG. 1 apparatus, for the measurement of a positional deviation in the and Y directions.

When as in the case (1), the chip rotation has been corrected separately, it is possible that the measurement with respect to only one alignment mark of each chip, in the X and Y directions, is sufficient for the preparation (calculation) of the reference grid. In such a case, the formation of only one latent image of one alignment mark, such as at 81' shown in FIG. 5, for each shot area 83' may be sufficient. However, if an optical system used for the detection of the latent image has an ability by which only the positional error in one of the X and Y directions is detectable, two latent images may be formed for each shot area.

In any case, after the reference grid is determined, the movement of the wafer stage 2 in the X and Y directions is controlled in accordance with the reference grid so that the step-and-repeat exposures of all the shot areas of the wafer 4 are executed (Step 180), whereby the exposure of the wafer 4 is accomplished.

Figure 6:
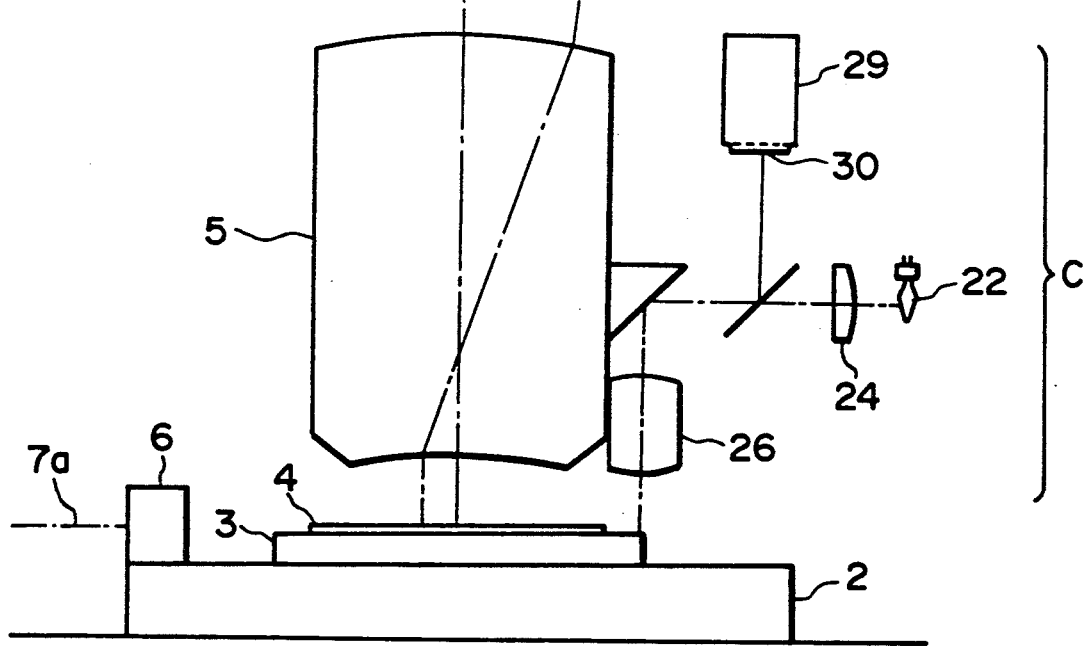
FIG. 6 is a schematic view of an exposure apparatus according to another embodiment of the present invention.

FIG. 6 is a schematic view showing the structure of an exposure apparatus according to another embodiment of the present invention. In this embodiment, each latent image is printed on a wafer by use of an objective lens system disposed above a reticle 9 and comprising optical elements such as a mirror 49 and so on. More specifically, the reticle 9 has an automatic alignment mark 56 which is irradiated with an exposing light passed through an objective lens 50, so that a latent image thereof is formed on the wafer 4. Denoted at 54 is a light guide which emits a light of the same wavelength as that of the light used for the printing of a circuit pattern of the reticle 9, formed on its pattern bearing surface 17, upon the wafer 4 with the aid of the projection lens system 5. The light for forming the latent image may be guided from a light source provided as the circuit pattern printing light source. Shutter device 55 operates to open, when the latent image is to be formed, to allow passage of the light from the light guide 54. Stop 53 is provided at a position which is optically conjugate with the alignment mark 56 with respect to lenses 52 and 50, and functions as a field stop for restricting the light so that an unwanted portion of the reticle 9 around the alignment mark 56 is prevented from being illuminated by the light from the light guide 54. The exposure apparatus includes an alignment optical system C having a similar structure as of the foregoing embodiment. However, it should be noted that in the present embodiment, an objective lens 26 is fixedly mounted to a barrel of the projection lens system 5 so that the optical axis of the lens 26 extends substantially in parallel to the optical axis of the projection lens system 5.

Figure 7:
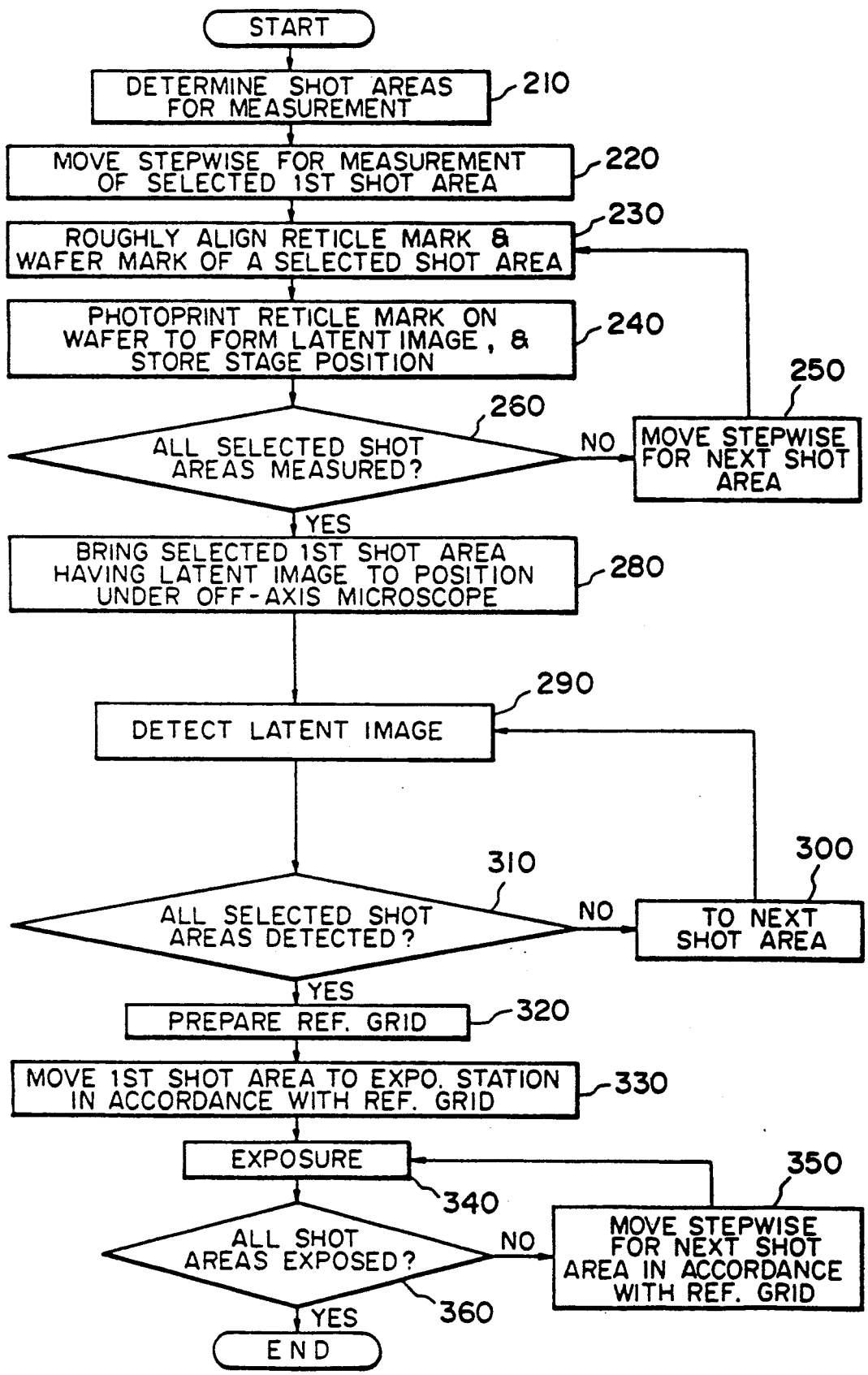
FIG. 7 is a flow chart showing the alignment and exposure operation of the FIG. 6 apparatus.

In the present embodiment, a relatively large interval is maintained between the optical axes of the objective lens 26 and the projection lens system 5. Accordingly, rather than the sequential operation described with reference to the flow chart of FIG. 4 wherein the formation of latent images of reticle marks upon the selected shot areas of the wafer 4 by use of the projection lens system 5 and the detection of the latent images by use of the objective lens 26 are executed alternately, the sequential operation such as shown in the flow chart of FIG. 7 wherein, after completion of the formation of latent images of the reticle mark or marks upon all the selected shot areas (selected for the measurement), the latent images formed on these selected shot areas are detected in sequence by use of the objective lens 26, is preferable in respect to the throughput. In the sequence of FIG. 7, as will be described later, it is not necessary to move the wafer stage 2 reciprocatingly between the projection lens system 5 and the objective lens 26, in regard to each of the shot areas selected as the subject of measurement.

The operation of the apparatus of the present embodiment will be described in detail with reference to the flow chart of FIG. 7. Briefly, the apparatus operates as follows:

(1) With regard to predetermined shot areas, selected as the subject of measurement, latent images of the alignment mark of the reticle are formed successively (Steps 210-270).

(2) The thus formed latent images and the alignment marks of the wafer are observed in a predetermined order by use of the alignment detecting system C which is an off-axis alignment detecting system (Steps 280-310).

(3) By using the values obtained by the observation, a reference grid is calculated (Step 320).

(4) In accordance with the reference grid, the stepwise movement of the wafer stage 2 and the exposure of the wafer are repeated (Steps 330-360).

Referring to FIG. 7, in response to a start command, a controller 100 determines several shot areas, of all the shot areas on the wafer 4, which should be selected as the subject of measurement (Step 210). Then, at Step 220, the wafer stage 2 is moved so that a first one of the selected shot areas is brought to an exposure station upon which a pattern of the reticle 9 can be projected by the projection lens system 5. At this time, the position of the stage 2 is determined by use of the output of a laser interferometer 7 so that the alignment mark of the one shot area of the wafer 4, brought to the exposure station, is approximately aligned with the alignment mark of the reticle 9 (Step 230). Subsequently, at Step 240, the alignment mark of the reticle 9 is photoprinted on the one shot area of the wafer as a latent image and, in addition thereto, the position of the stage 2 at that time is detected from the output of the laser interferometer 7 and is stored into the controller 100. At Step 260, discrimination is made as to whether the formation of latent images with regard to all the selected shot areas (designated as the subject of measurement) is completed. If not completed, the sequence goes to Step 250 whereat the stage 2 is moved so as to bring the next one of the selected shot areas to the exposure station. Thereafter, the sequence goes back to Step 230 and the above-described operation is repeated.

If the result of discrimination at Step 260 shows completion of the latent image formation with regard to all the shot areas, the sequence goes to Step 280 whereat a first one of the selected shot areas, which is the shot area to be subjected first to the detection of the latent image, is brought to a position below the objective lens 26 by means of the stage 2. The order of the latent image detection for the selected shot areas, designated as the subject of measurement, has been determined preparatorily such as, for example, at Step 210. Then, at Step 290, the latent image related to the shot area just having been positioned is detected and the positional error of that shot area is calculated in the manner described hereinbefore. The calculated positional error is stored. After this, at Step 310, discrimination is made as to whether the detection of the latent images related to all the selected shot areas is completed. If not completed, the sequence goes to Step 300 whereby the next one of the selected shot areas is brought to the position below the objective lens 26 by means of the stage 2. Thereafter, the sequence goes back to Step 290 and the above-described operation is repeated. If the latent image detection is completed, the sequence goes to Step 320 whereat, as in the manner described hereinbefore, a reference grid is prepared on the basis of the detected positional errors of the latent images concerning the selected shot areas and by use of the positions of the wafer stage 2 having been assumed with regard to the detection of the latent images. It should be noted that, in the present embodiment, no alignment mark may be formed on the wafer 4. After preparation of the reference grid, the wafer stage 2 is moved stepwise while being controlled in accordance with the reference grid, and step-and-repeat exposures of all the shot areas on the wafer 4 are executed, as shown at Steps 330-350.

The manner of the sequential operation of the present embodiment is applicable also to the embodiment described with reference to FIG. 1. If it is applied to the FIG. 1 embodiment, it becomes unnecessary to swingingly move the mirror 27 each time a latent image is printed on one shot area. This is preferable in respect to the throughput. Also, for further improvements in the throughput, use of the alignment detecting system C in the manner allowing detection of latent images of adjacent shot areas at the same time is effective. This will be described below in more detail.

Figure 3:
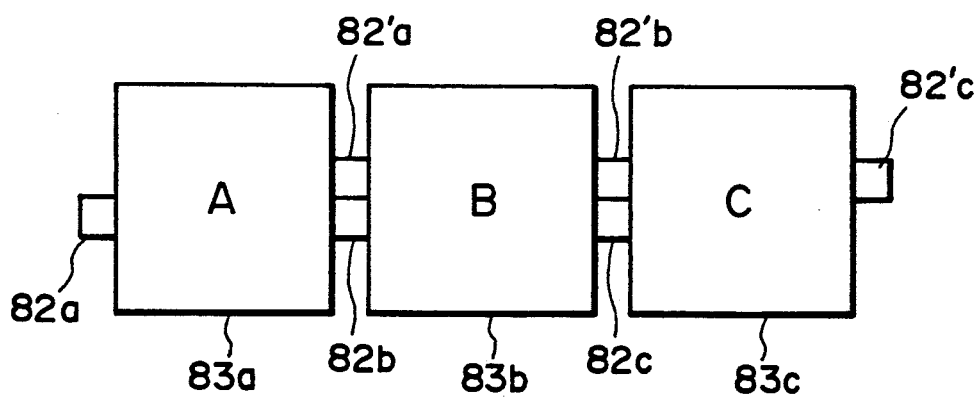
FIG. 3 is a schematic view exemplifying the manner of the provision of alignment marks in a case when alignment marks of adjacent chips are to be observed simultaneously by use of an exposure apparatus shown in FIG. 1 or 6.

With reference to two adjacent shot areas 83a and 83b shown in FIG. 3, the alignment marks of these shot areas are formed so that one (82'a) of the alignment marks 82a and 82'a of the shot area 83a is juxtaposed, on a scribe line between the shot areas 83a and 83b, with one (82b) of the alignment marks 82b and 82'b of the shot area 83b. These juxtaposed alignment marks and latent images of reticle marks, correlated to these juxtaposed marks, are detected at the same time by means of one objective lens of the alignment detecting system. Where the alignment detecting system C is of a binocular type having two objective lenses, four alignment marks of two shot areas can be detected at the same time. Thus, the required number of data can be obtained more quickly.

Figure 8:
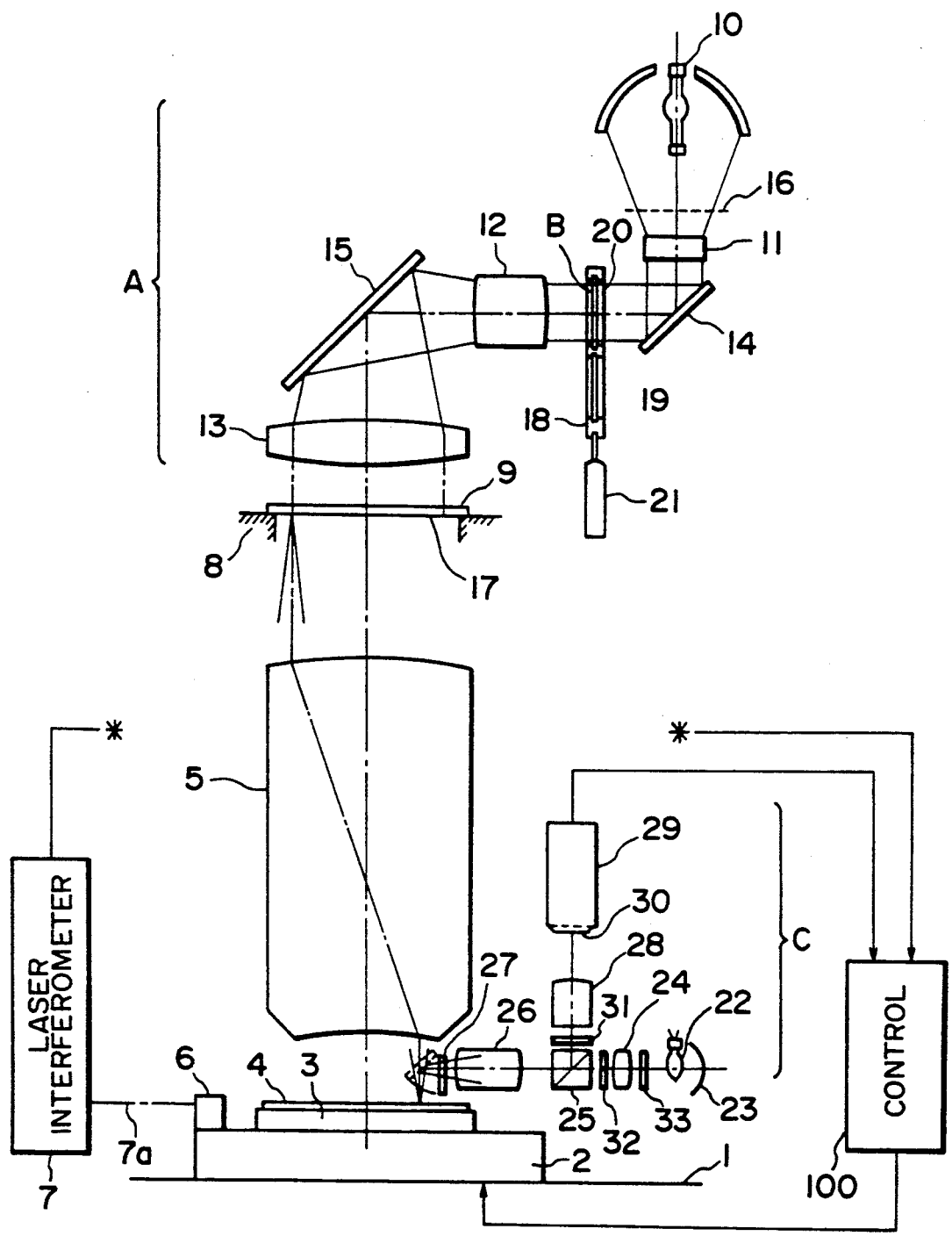
FIG. 8 is a schematic and diagrammatic view of an exposure apparatus according to a further embodiment of the present invention.

FIG. 8 is a schematic view showing the structure of an exposure apparatus according to a further embodiment of the present invention. As shown in FIG. 8, the system as a whole of the exposure apparatus is and placed on a surface plate 1 whose detailed structure is not shown. More specifically, disposed on the surface plate 1 is a wafer stage 2 which is effective to movably support a wafer holding plate 3 and a wafer 4, held thereby by vacuum attraction, for movement along a plane (X-Y plane) perpendicular to an optical axis of a projection lens system 5 extending in a direction of a Z-axis. The wafer stage 2 has an optical mirror 6 mounted thereto and, by a well-known method by which a light 7a from a laser interferometer 7 is projected upon the mirror 6, the coordinate position of the wafer stage 2 on the X-Y plane can be detected. Also, the wafer stage 2 is controlled by a controller 100 so that it is moved exactly by a designated distance. Disposed above the projection lens system 5 is a reticle 9 which is held by a reticle holding table 8. When the reticle 9 is irradiated with a light supplied from an illumination optical system A disposed above the reticle 9, a pattern formed on the reticle 9 is projected upon and transferred onto the surface of the wafer 4, through the projection lens system 5.

The illumination optical system A operates to project a light, emitted from a super-pressure mercury lamp 10, uniformly upon the reticle 9 and includes first to third condenser lenses 11, 12 and 13 and first and second mirrors 14 and 15 for deflecting the light. Shutter 16 is operable to control the exposure.

The second and third condenser lenses 12 and 13 and the second mirror 15 are cooperable to define a plane, at the position denoted by B in FIG. 8, which is optically conjugate with and in an imaging relation with the pattern bearing surface 17 of the reticle 9. At the position B, a suitable masking means is provided so as to allow that only a particular and desired portion of the reticle 9 is illuminated. In the plane denoted at B, a pattern exposing masking member 19 and an alignment mark exposing masking member 20, held by a common frame 18, are provided. These masking members 19 and 20 are alternately inserted into the path of light by the selective actuation of a cylinder 21.

Figure 11:
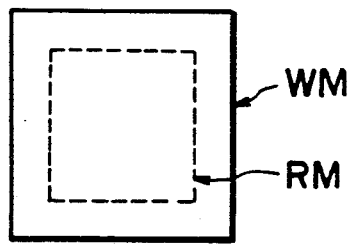
FIG. 11 is a schematic view exemplifying an alignment mark of a wafer and a latent image formed on the wafer.

An alignment mark formed on the wafer 4 and a latent image printed on the wafer 4 by the selection of the alignment mark exposing masking member 20 are such as, for example, shown in FIG. 11. In this Figure, reference character WM denotes the alignment mark of the wafer 4 and reference character RM is the latent image of a reticle mark printed on the wafer 4.

The mark WM and the latent image RM are detected, in the manner which will be described later, by means of an alignment optical system C disposed so that a portion thereof protrudes into the space between the projection lens system 5 and the wafer 4.

Figure 9:
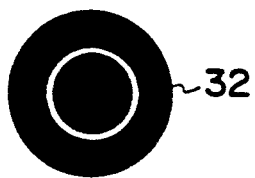
FIG. 9 is a schematic view of a ring stop used in the FIG. 8 apparatus.

In the alignment optical system C, the light emanating from a halogen lamp 22 first passes through a filter 33 and then is concentrated by a condensing lens 24 at the surface of a ring stop 32 which is disposed on a focal plane of the lens 24. The filter 33 is adapted to transmit a light in such a wavelength range, for example, a light of a wavelength not shorter than 520 nm, that does not change the property of a resist material used. The ring stop 32 has a shape such as shown in FIG. 9 and is adapted to transmit the light only through a portion thereof as depicted as a non-painted inner circular region. The positional relationship between the ring stop 32 and the halogen lamp 22 is just equivalent to the relationship between a pupil plane and the surface of an object. Also, the plane of the ring stop 32 corresponds to a rear focal plane of an objective lens 26 which will be described later.

The light passed through the ring stop 32 is directed by way of a half prism 25 and the aforementioned objective lens 26 to a movable mirror 27. It should be noted here that the half prism 25 is disposed at one side of the rear focal plane of the objective lens 26, which side is nearer to the wafer 4, so as to allow that an optical element is disposed on the rear focal plane.

The light collected by the objective lens 26 irradiates the wafer surface when the movable mirror 27 is in a positional relation as inclined by 45 degrees to the optical axis, as depicted by broken lines in FIG. 8. The light reflected by the wafer surface goes back by way of the movable mirror 27 and the objective lens 26 to the half prism 25 by which the optical axis is bent or deflected upwardly. Thereafter, the light reaches a phase plate 31 which is disposed on a rear focal plane of the objective lens 26.

Figure 10A:
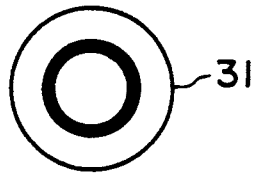
FIGS. 10A and 10B are schematic views showing a phase plate used in the FIG. 8 apparatus.
Figure 10B:
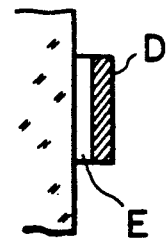

FIG. 10A is a front elevational view of such a phase plate 31. Depicted in this Figure as an inner painted circular region is a portion of the phase plate 31 which comprises, as shown in a sectional view of FIG. 10B, an absorbing film layer D effective to absorb light and a non-absorbing film layer E effective to change the phase. These film layers D and E are provided at a location through which a zero-th order diffraction light passes, to thereby control the intensity and the phase of the zero-th order diffraction light.

The light incident on the phase plate 31 passes therethrough and is directed by way of a relay lens 28 to the surface 30 of an image pickup tube 29, so that an image of the alignment mark of the wafer 4 as well as an image of the latent image (photoprint) of the reticle mark, having been formed on the wafer 4, are formed on the surface 30 of the image pickup tube 29.

As will be understood from the foregoing explanation, the alignment optical system C provides a phase contrast microscope. Since a phase contrast microscope can change the contrast or brightness/darkness of an image without changing the shape of the image, by controlling, at a pupil plane and by use of a phase plate, the intensity and phase of a zero-th order diffraction image, it is very suitable for observation of a sample, such as a latent image, whose major portion shows a light transmissibility but has a refractive index different from a surrounding portion so that the contrast is very low. Namely, the image having formed on the surface 30 by the phase contrast microscope, as described hereinbefore, has a good contrast so that it is contributable to improvements in the detection probability and the alignment accuracy.

The video signal concerning the image formed on the surface 30 of the image pickup tube 29 is transmitted to the controller 100 along a signal line. In the controller, the positional error between the reticle 9 and the wafer 4 i is calculated. The calculated positional error is fed back to the wafer stage 2 so that the reticle 9 and the wafer 4 is aligned with each other.

Figure 12:
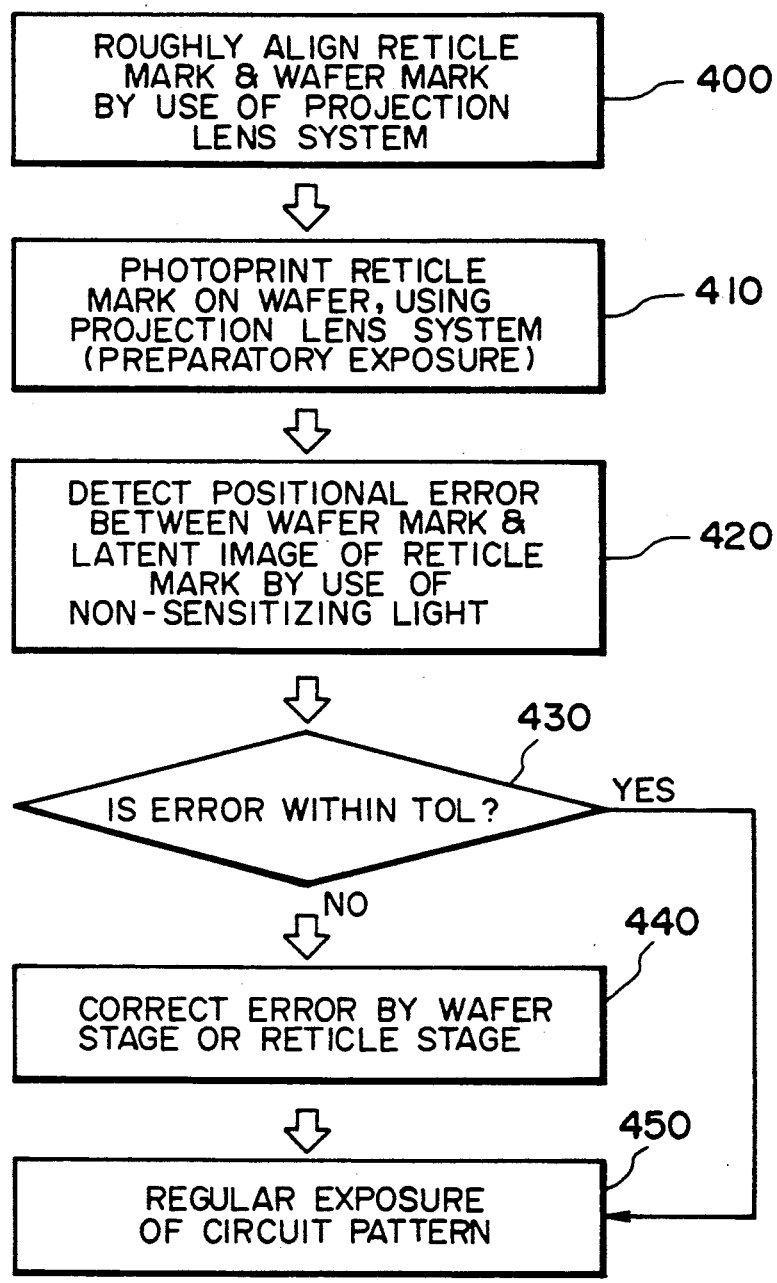
FIG. 12 is a flow chart showing the sequence of an alignment and exposure operation in the FIG. 8 apparatus.

An example of the alignment sequence using the FIG. 8 apparatus is shown in FIG. 12. First, at Step 400, the position of the wafer stage 2 is controlled by use of the output of the laser interferometer 7 so as to approximately align the alignment mark of the reticle with the alignment mark of the wafer. Thereafter, at Step 410, the alignment mark of the reticle is photoprinted on the wafer 4 as a latent image. Then, at Step 420, the alignment mark of the wafer and the thus formed latent image on the wafer 4 are detected by use of the alignment detecting system C, and the positional error therebetween is calculated. At Step 430, discrimination is made as to whether the calculated positional error is within a predetermined tolerance. If so, the sequence goes to Step 450 whereby the circuit pattern of the reticle is printed on the wafer. If not so, the sequence goes to Step 440 so that the position of the stage 2 is corrected by an amount corresponding to the calculated positional error. After this, the sequence goes to Step 450 so that the exposure of the circuit pattern is executed.

Figure 13:
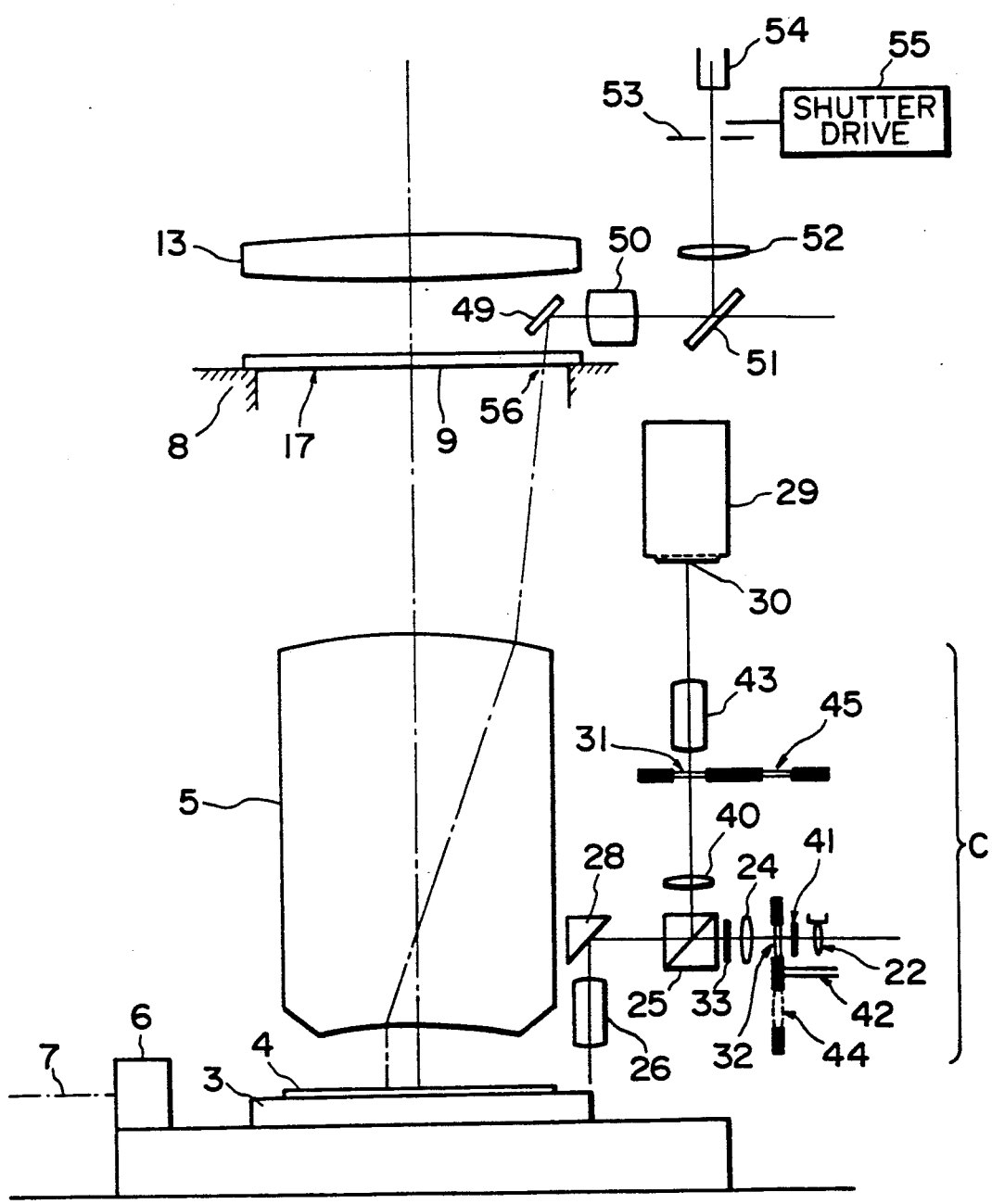
FIG. 13 is a schematic view of an exposure apparatus according to still a further embodiment of the present invention.

FIG. 13 is a schematic view showing the structure of an exposure apparatus according to a still further embodiment of the present invention. In this embodiment, each latent image is printed on a wafer by use of an objective lens system disposed above a reticle 9 and comprising optical elements such as a mirror 49 and so on. More specifically, the reticle 9 has an automatic alignment mark 56 which is irradiated with an exposing light passed through an objective lens 50, so that a latent image thereof is formed on the wafer 4. Denoted at 54 is a light guide which emits a light of the same wavelength as that of the light used for the printing of a circuit pattern of the reticle 9, formed on its pattern bearing surface 17, upon the wafer 4 with the aid of the projection lens system 5. The light for forming the latent image may be guided from a light source provided as the circuit pattern printing light source. Shutter device 55 operates to open, when the latent image is to be formed, to allow passage of the light from the light guide 54. Stop 53 is provided at a position which is optically conjugate with the alignment mark 56 with respect to lenses 52 and 50, and functions as a field stop for restricting the light so that an unwanted portion of the reticle 9 around the alignment mark 56 is prevented from being illuminated by the light from the light guide 54.

Optical element denoted at 26 and those following the element 26 provide an off-axis alignment detecting system C, which functions to detect an alignment mark on a wafer and a latent image of a reticle mark formed on the wafer 4.

As shown, the alignment detecting system C includes a light source 22; a ground glass 41; a ring stop 32 which is similar to that shown in FIG. 8 and which is optically conjugate with the position of a pupil of a telecentric objective lens 26 with respect to a lens 24; and a color filter which is similar to that used in the FIG. 8 example. The ring stop 32 is also optically conjugate with a phase plate 31. The pair of the ring stop 32 and the phase plate 31 are used when the system operates as a phase contrast microscope to observe a latent image.

On the other hand, the combination of the ring stop 32 and the phase plate 31 may be disadvantageous, in some cases, in respect to the quantity of light where they are used to observe an alignment mark of a wafer correlated to the latent image. This is because, usually, there are many varieties in regard to the sectional structure of a wafer, which varies with the process or the type of the wafer. Also, the combination of the ring stop 32 and the phase plate 31 may be disadvantageous in a case where a high-contrast image can be formed by use of a diffraction light or a scattered light, such as in the case of a stage mark formed on a chuck such as at 3 as a mark having an edge. In order to correct these problems, each of the ring stop 32 and the phase plate 31 is arranged to be used interchangeably. Namely, the alignment detection system C can effect ordinary bright-field or dark-field observation, as desired. For the bright-field observation, each of the optical elements denoted at 44 and 45 may be a simple parallel flat plate. For the dark-field observation, the elements 44 and 45 may be filters each having a shape effective to intercept a zero-th order light while utilizing mutual conjugate relation therebetween. Denoted at 43 is an erector having a function for forming an image of the wafer on the image pickup device.

With the described structure, the detection of the wafer signal is attainable smoothly. Accordingly, it becomes easy to meet various wafer processes and, additionally, the reliability of the system is enhanced. Further, when, for the so-called base line correction, a stage mark formed on a chuck 3 and a latent image printed on a wafer 4 are detected to measure a distance between the optical axes of a projection lens system 5 and an objective lens 26, both of them can be detected by use of the same objective lens 26 and the same image pickup tube 29. Therefore, high-precision of the base line correction is attainable.

Figure 14:
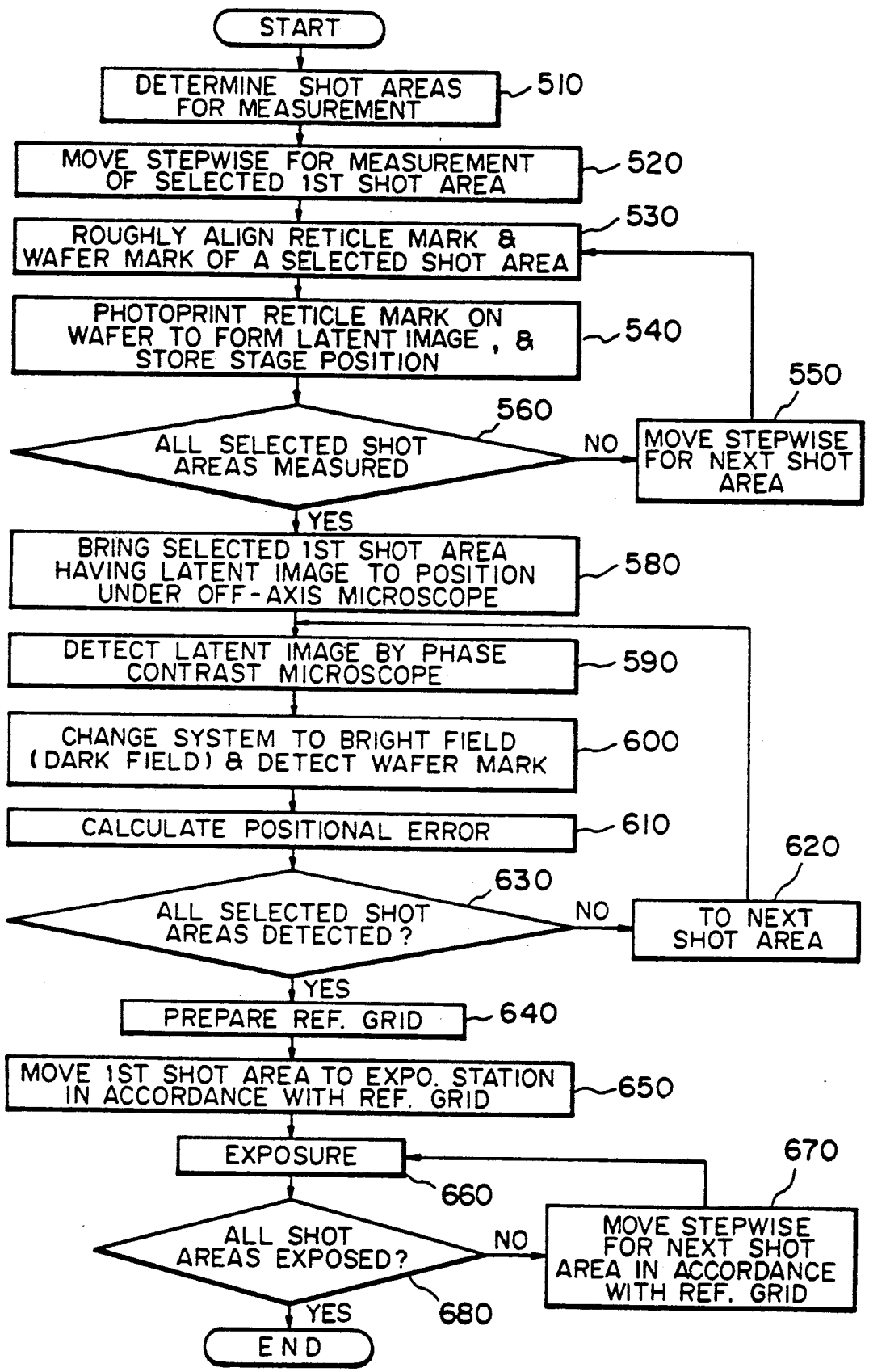
FIG. 14 is a flow chart showing the sequence of an alignment and exposure operation in the FIG. 13 apparatus.

The operation of the present embodiment is executed in accordance with the flow chart shown in FIG. 14, essentially in the same manner as the FIG. 7 example. Namely:

(1) With regard to predetermined shot areas, selected as the subject of measurement, latent images of the alignment mark of the reticle are formed successively (Steps 510–570).

(2) The thus formed latent images and the alignment marks of the wafer are observed in a predetermined order by use of the off-axis alignment detecting system (Steps 580–510).

(3) By using the values obtained by the observation, a reference grid is calculated (Step 620).

(4) In accordance with the reference grid, the stepwise movement of the wafer stage and the exposure of the wafer are repeated (Steps 650–680).

In the described manner, global alignment and step-and-repeat exposure of the wafer are executed.

The present embodiment may be modified in the following manner:

For example, in consideration of the possibility that in an actual wafer process different wafers have different reflection factors or different resist materials have different transmission factors, different filters 33 and different phase plates 31 may be prepared and used interchangeably by use of a turret or other means and, additionally, the contrast of a signal may be detected so that the turret or other means may be automatically controlled with the aid of a servo con By doing so, optimum conditions can be always selected for the alignment operation. This ensures detection of signals of good contrast independently of the wafer process and, therefore, high mark detection probability and high alignment accuracy can be retained stably.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
    exposing means for printing, on a workpiece, a pattern formed on an original;
    latent image forming means for printing, on the workpiece, an image of a mark provided on the original so as to form on the workpiece a latent image of the mark;
    moving means for moving the workpiece so that the pattern of the original is printed on different portions of the workpiece by said exposing means;
    latent image detecting means for detecting each of the latent images of the mark, formed by said latent image forming means in relation to those portions of the workpiece of a number smaller than the number of all the portions of the workpiece, said latent image detecting means producing signals corresponding to the detected latent images; and
    controlling means operable to calculate the state of array of all the portions of the workpiece, on the basis of the signals produced from said latent image detecting means, said controlling means also being operable to control the movement of the workpiece by said moving means for step-and-repeat exposures of the workpiece in accordance with the result of calculation.

2. An apparatus according to claim 1, wherein said latent image forming means uses a light having substantially the same wavelength as that of the light used by said exposing means.

3. An apparatus according to claim 1, wherein said latent image detecting means is operable to detect, at the same time, latent images of the mark as having been formed in relation to adjacent portions of the workpiece.

4. An exposure method, comprising the steps of:
    repeatedly printing on a workpiece an image of a mark of a pattern provided on an original while moving the workpiece, so that latent images of the mark are formed in relation to different portions of the workpiece;
    detecting each of the latent images of the mark, formed on the workpiece, to obtain signals related to the latent images of the mark; and
    effecting a desired calculation by use of the obtained signals and controlling, in accordance with the result of the calculation, the movement of the workpiece for step-and-repeat exposures of the different portions of the workpiece to the pattern formed on the original.

5. An exposure apparatus, comprising:
    exposing means for printing a pattern of an original on a workpiece;
    latent image forming means for printing on the workpiece an image of a mark provided on the original to form a latent image of the mark on the workpiece;
    latent image detecting means having a phase contrast microscope, for detecting a latent image of the mark formed on the workpiece by said latent image forming means; and
    controlling means operable, at the time of printing of the pattern of the original upon the workpiece by said exposing means, to control the position of the workpiece relative to the original in accordance with a signal produced by said latent image detecting means.

6. An apparatus according to claim 5, wherein said exposing means and said latent image forming means include a common projection optical system for printing the pattern and the mark on the workpiece, respectively, and said exposing means and said latent image forming means use substantially the same wavelength of light for the printing.

7. An apparatus according to claim 5, wherein said latent image detecting means includes at least one of a bright-field microscope and a dark-field microscope, which is interchangeably used with said phase contrast microscope.

8. An exposure apparatus comprising:
    exposing means for printing, on a workpiece, a pattern formed on an original;
    image forming means for printing on the workpiece, a mark provided on the original by forming a latent image of the mark on a photosensitive layer of the workpiece;
    moving means for moving the workpiece so that the pattern of the original is printed on different portions of the workpiece by said exposing means;
    image detecting means for detecting each of the latent images of the mark formed by said image forming means in a reference array, the latent images formed in the reference array being less than the total images formed on the workpiece, said image detecting means producing signals corresponding to the detected latent images; and
    controlling means operable to calculate the state of array of all of the portions of the workpiece, on the basis of the signals produced by said image detecting means, said controlling means also operable to control the movement of the workpiece by said moving means for step-and-repeat exposures of the workpiece in accordance with the results of the calculation.

9. An exposure method, comprising the steps of:
    repeatedly forming on a photosensitive layer of a workpiece, a mark of a pattern provided on an original while moving the workpiece, for piecing latent images of the mark in relation to different portions of the workpiece;
    detecting each of the latent images of the mark formed on the photosensitive layer of the workpiece to obtain signals related to the latent images of the mark; and
    effecting a desired calculation by use of the obtained signals and controlling, in accordance with the result of the calculation, the movement of the workpiece for step-and-repeat exposures of the different portions of the workpiece to the pattern formed on the original.

10. An exposure method, in the manufacture of semiconductor devices, for printing a device pattern of a mask on different zones of a semiconductor wafer in sequence, said method comprising the steps of:
- selecting particular ones of the different zones of the wafer as measurement sample zones;
- printing an alignment mark of the mask on the measurement sample zones in sequence while moving a wafer stage carrying the wafer;
- detecting the printed alignment marks of the measurement sample zones through an alignment optical system while moving the wafer stage, and producing detection signals corresponding tot he results of the detection;
- determining data related to disposition of the different zones of the wafer, in accordance with the detection signals produced and by calculation; and
- printing the device pattern of the mask on the different zones of the wafer in sequence, while controlling movement of the wafer stage in accordance with the determined data.

11. A method according to claim 10, wherein said printing step comprises printing the device pattern of the mask on the wafer by projection through a projection optical system, and said detecting step comprises detecting each alignment mark printed on the wafer through the alignment optical system free from intervention of the projection optical system.

12. An exposure method, in the manufacture of semiconductor devices, for printing a device pattern of a mask on different zones of a semiconductor wafer in sequence, said method comprising the steps of:
- selecting particular ones of the different zones of the wafer as measurement sample zones;
- printing an alignment mark of the mask on each measurement sample zone, and detecting the printed alignment mark through an alignment optical system for producing detection signals corresponding to the printed alignment marks said printing step and said detecting step being performed while moving a wafer stage which carries the wafer;
- determining data related to disposition of the different zones of the wafer, in accordance with the detection signals produced and by calculation; and
- printing the device pattern of the mask on the different zones of the wafer in sequence, while controlling movement of the wafer stage in accordance with the determined data.

13. A method according to claim 12, wherein said printing step comprises printing the device pattern of the mask on the wafer by projection through a projection optical system, an said detecting step comprises detecting each alignment mark printed on the wafer through the alignment optical system free from intervention of the projection optical system.

14. A method, in the manufacture of semiconductor devices, for exposing different zones of a semiconductor wafer with exposure light in sequence, said method comprising the steps of:
- selecting particular ones of the different zones of the wafer as measurement sample zones;
- irradiating each measurement sample zone with light substantially the same as the exposure light, and detecting the irradiated measurement sample zone through a detection optical system for producing a corresponding detection signal, said irradiating step and said detecting step being performed while moving a wafer stage which carried the wafer;
- determining data related to disposition of the different zones of the wafer, in accordance with the detection signals produced and by calculation; and
- exposing the different zones of the wafer with the exposure light in sequence, while controlling movement of the wafer stage in accordance with the determined data.

15. A method according to claim 14, further comprising alternately effecting said irradiating step and said detecting step with respect to the measurement sample zones.

16. A method according to claim 14, further comprising beginning said detecting step after all the measurement sample zones have been irradiated with the light in said irradiating step.

17. An exposure method, in the manufacture of semiconductor devices, for exposing different zones of a semiconductor wafer with exposure light in sequence, said method comprising the steps of:
- placing the wafer on a wafer stage;
- irradiating predetermined ones of the different zones of the wafer with first light from a first light source, and detecting the irradiated zones of the wafer through a detection optical system by irradiating the zones with second light from a second light source for producing corresponding detection signals, said irradiating step and said detecting step being performed while moving the wafer stage;
- determining data related to disposition of the different zones of the wafer in accordance with the detection signals produced, by calculation; and
- exposing the different zones of the wafer with the exposure light in sequence, while controlling movement of the wafer stage in accordance with the determined data.

18. A method according to claim 17, further comprising alternately effecting said irradiating step and said detecting step with respect to the predetermined zones of the wafer.

19. A method according to claim 17, further comprising beginning said detecting step after all the predetermined zones have been irradiated with the first light in said irradiating step.

20. A semiconductor device manufacturing method comprising the steps of:
- holding on a reticle holder a reticle having an alignment mark and a pattern;
- holding on a substrate holder a substrate having a photosensitive layer and a plurality of shot areas including selectable areas;
- exposing the selectable areas to the alignment mark of the reticle through an exposure optical system, while moving the substrate holder, to permit a detection optical system to detect positional information for the selectable areas;
- obtaining grid information indicative of positions of the shot areas using the positional information of the selectable areas; and
- moving the substrate holder on the basis of the grid information when the substrate is exposed to the pattern of the reticle through the exposure optical system.

21. A method according to claim 20, further comprising effecting said exposing step and the detection by the detection optical system for each of the selectable areas.

22. A method according to claim 20, further comprising effecting the detection by the detection optical system after effecting said exposing step for all of the selectable areas.

* * * * *

UNITED STATES PATENT AND TRADEMARK OFFICE
CERTIFICATE OF CORRECTION

PATENT NO. : 5,140,366

DATED : August 18, 1992

INVENTOR(S) : Takahisa Shiozawa, et al.

It is certified that error appears in the above-identified patent and that said Letters Patent is hereby corrected as shown below:

COLUMN 3

Line 33, "the and" should read --the X and--.

COLUMN 6

Line 6, "$\Delta X=(\Delta X_R \Delta X_L)/2$" should read --$\Delta X=(\Delta X_R+\Delta X_L)/2$--.
Line 8, "$\Delta Y=(\Delta Y_R \Delta Y_L)/2$" should read --$\Delta Y=(\Delta Y_R+\Delta Y_L)/2$--.

COLUMN 12

Line 52, "(Steps 580-510)." should read --(Steps 580-610).--.

COLUMN 13

Line 2, "servo con By" should read --servo control system. By--; and
Line 39, "calculation." should read --the calculation.--.

UNITED STATES PATENT AND TRADEMARK OFFICE
CERTIFICATE OF CORRECTION

PATENT NO. : 5,140,366

DATED : August 18, 1992

INVENTOR(S) : Takahisa Shiozawa, et al.

It is certified that error appears in the above-identified patent and that said Letters Patent is hereby corrected as shown below:

COLUMN 14

Line 54, "piecing" should read --printing--.

COLUMN 15

Line 11, "tot he" should read --to the--; and
    Line 68, "carried" should read --carries--.

Signed and Sealed this

Twelfth Day of October, 1993

Attest:

BRUCE LEHMAN

Attesting Officer      Commissioner of Patents and Trademarks